(12) United States Patent
Fung

(10) Patent No.: US 12,148,832 B2
(45) Date of Patent: Nov. 19, 2024

(54) METHOD OF FORMING FINFET WITH LOW-DIELECTRIC-CONSTANT GATE ELECTRODE SPACERS

(71) Applicant: TAIWAN SEMICONDUCTOR MANUFACTURING CO., LTD., Hsinchu (TW)

(72) Inventor: Ka-Hing Fung, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/356,080

(22) Filed: Jul. 20, 2023

(65) Prior Publication Data

US 2023/0361214 A1 Nov. 9, 2023

Related U.S. Application Data

(60) Continuation of application No. 17/831,077, filed on Jun. 2, 2022, now Pat. No. 11,749,755, which is a division of application No. 15/396,900, filed on Jan. 3, 2017, now abandoned.

(60) Provisional application No. 62/426,671, filed on Nov. 28, 2016.

(51) Int. Cl.
| | |
|---|---|
| *H01L 21/8238* | (2006.01) |
| *H01L 21/8234* | (2006.01) |
| *H01L 29/417* | (2006.01) |
| *H01L 29/66* | (2006.01) |

(Continued)

(52) U.S. Cl.
CPC ...... *H01L 29/785* (2013.01); *H01L 29/41791* (2013.01); *H01L 29/6653* (2013.01); *H01L 29/66545* (2013.01); *H01L 29/6656* (2013.01); *H01L 29/66795* (2013.01); *H01L 21/823425* (2013.01); *H01L 21/823468* (2013.01);
(Continued)

(58) Field of Classification Search
CPC ......... H01L 29/6656; H01L 21/823468; H01L 21/823864; H01L 29/785; H01L 29/41791; H01L 29/66795
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |

(Continued)

FOREIGN PATENT DOCUMENTS

WO 2018004687 1/2018

*Primary Examiner* — Erik Kielin
(74) *Attorney, Agent, or Firm* — Maschoff Brennan

(57) ABSTRACT

A method includes forming a gate stack over a fin of a substrate; sequentially depositing a first dielectric layer, a second dielectric layer, a third dielectric layer, and a filling dielectric over the gate stack, wherein the second dielectric layer has a lower dielectric constant than dielectric constants of the first and third dielectric layers; forming a dielectric cap over the first, second, third dielectric layers and the filling dielectric; etching the dielectric cap, the first, second, third dielectric layers, and the filling dielectric simultaneously, to form gate spacers on opposite sidewalls of the gate stack and expose a top surface of the fin; and after the gate spacers are formed, forming an epitaxy source/drain structure in contact with one of the gate spacers and the top surface of the fin.

20 Claims, 13 Drawing Sheets

(51) Int. Cl.
*H01L 29/78* (2006.01)
*H01L 29/165* (2006.01)

(52) U.S. Cl.
CPC .... *H01L 21/823864* (2013.01); *H01L 29/165* (2013.01); *H01L 29/7848* (2013.01)

(56) References Cited

U.S. PATENT DOCUMENTS

| | | | |
|---|---|---|---|
| 8,887,106 | B2 | 11/2014 | Ho et al. |
| 11,749,755 | B2* | 9/2023 | Fung .................. H01L 29/6656 257/401 |
| 2006/0226453 | A1 | 10/2006 | Wang |
| 2007/0158756 | A1 | 7/2007 | Dreeskornfeld |
| 2011/0147882 | A1 | 6/2011 | Tsutsue |
| 2013/0015533 | A1 | 1/2013 | Wang |
| 2014/0282326 | A1 | 9/2014 | Chen |
| 2014/0369115 | A1 | 12/2014 | Kim |
| 2015/0194524 | A1 | 7/2015 | Hu |
| 2015/0214367 | A1 | 7/2015 | Chang |
| 2015/0228754 | A1 | 8/2015 | Sung |
| 2015/0263122 | A1 | 9/2015 | Hsiao |
| 2016/0020110 | A1 | 1/2016 | Lu |
| 2016/0351570 | A1* | 12/2016 | Park .................. H01L 21/3065 |
| 2016/0351715 | A1 | 12/2016 | Jung |
| 2017/0125539 | A1 | 5/2017 | Cheng |
| 2017/0221907 | A1 | 8/2017 | Hsieh |
| 2017/0243955 | A1 | 8/2017 | Shinohara |
| 2017/0352726 | A1 | 12/2017 | Zhou |
| 2017/0358577 | A1 | 12/2017 | Lin |
| 2018/0047632 | A1 | 2/2018 | Zhang |
| 2021/0036143 | A1 | 2/2021 | Liao |

* cited by examiner

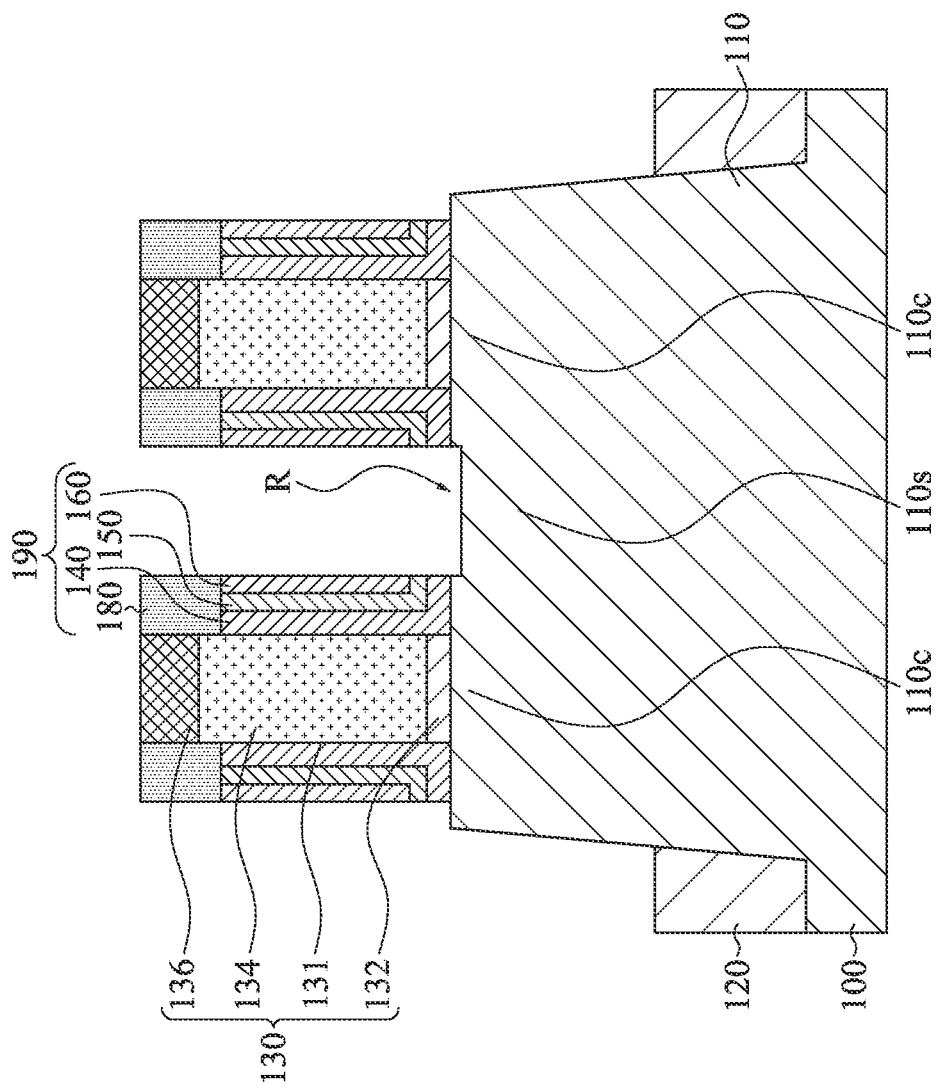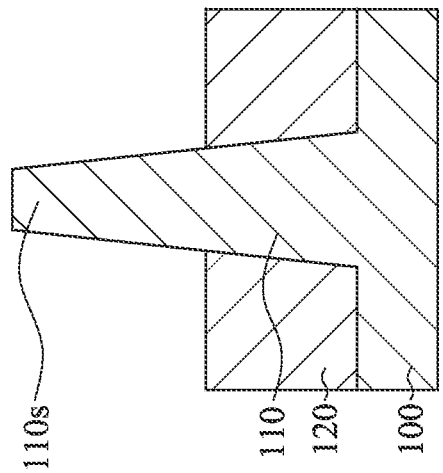

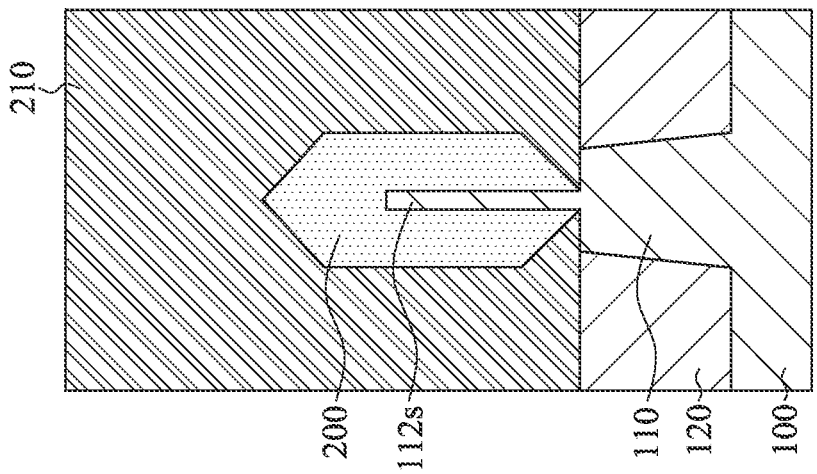
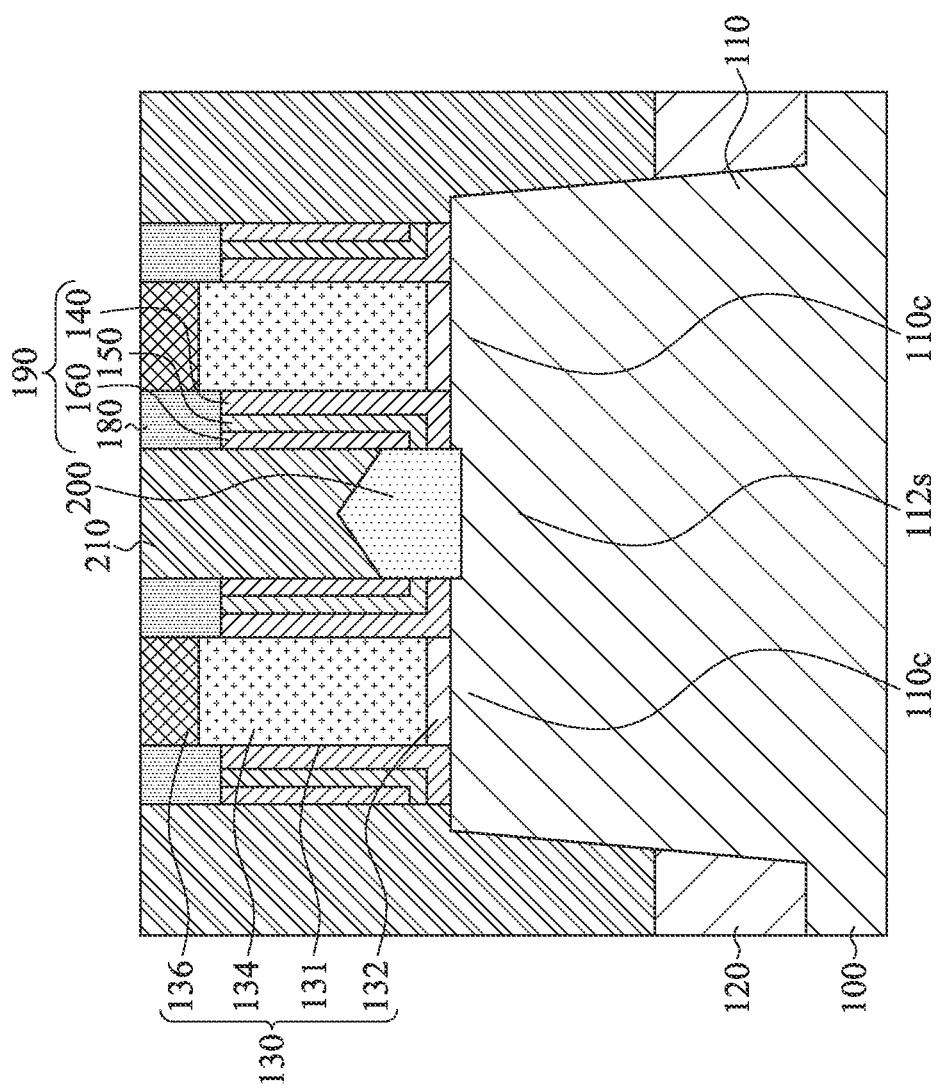
Fig. 10B
Fig. 10A

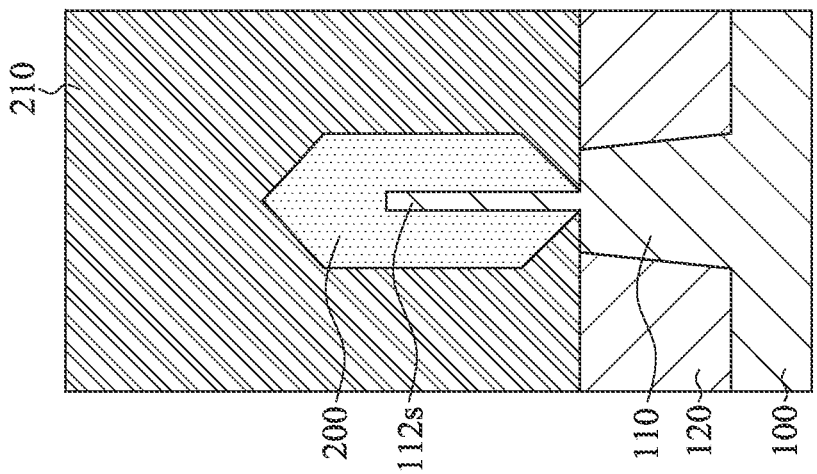
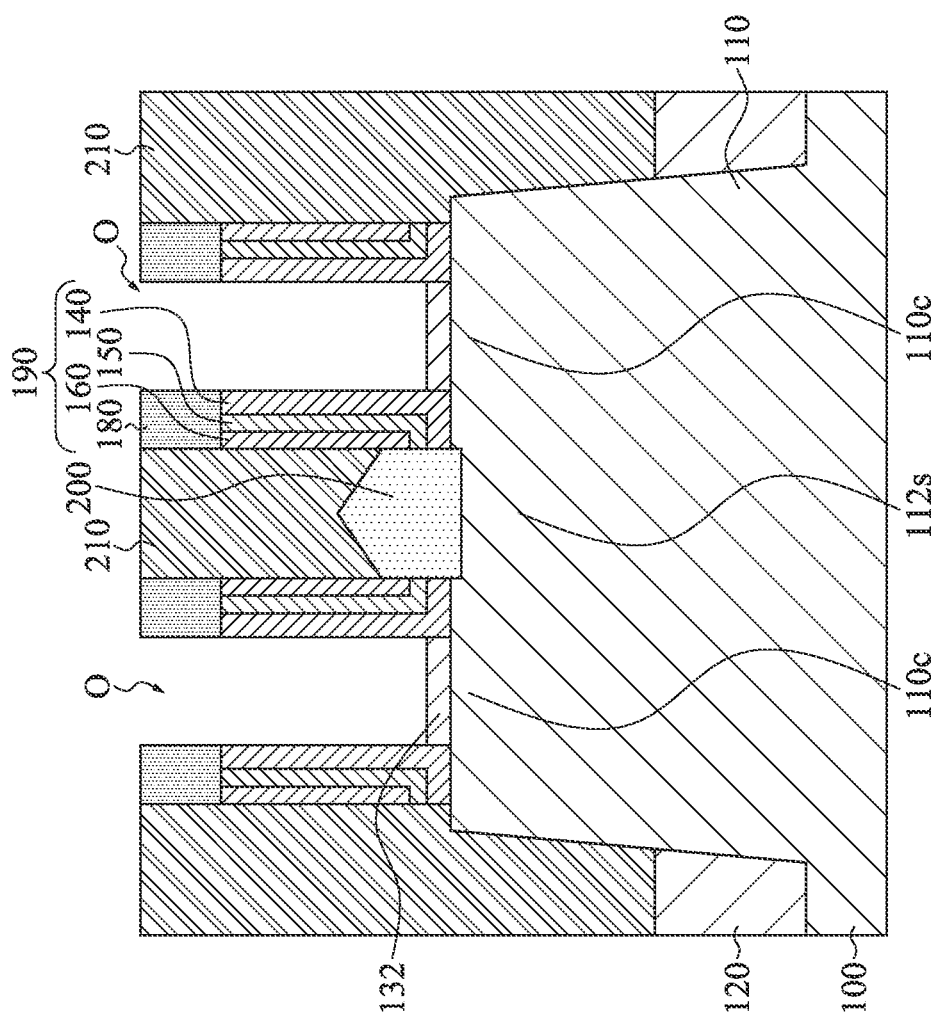
Fig. 11B
Fig. 11A

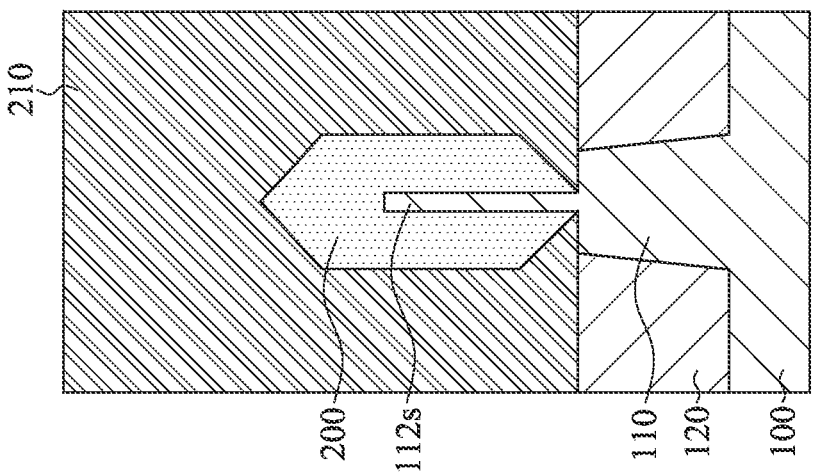
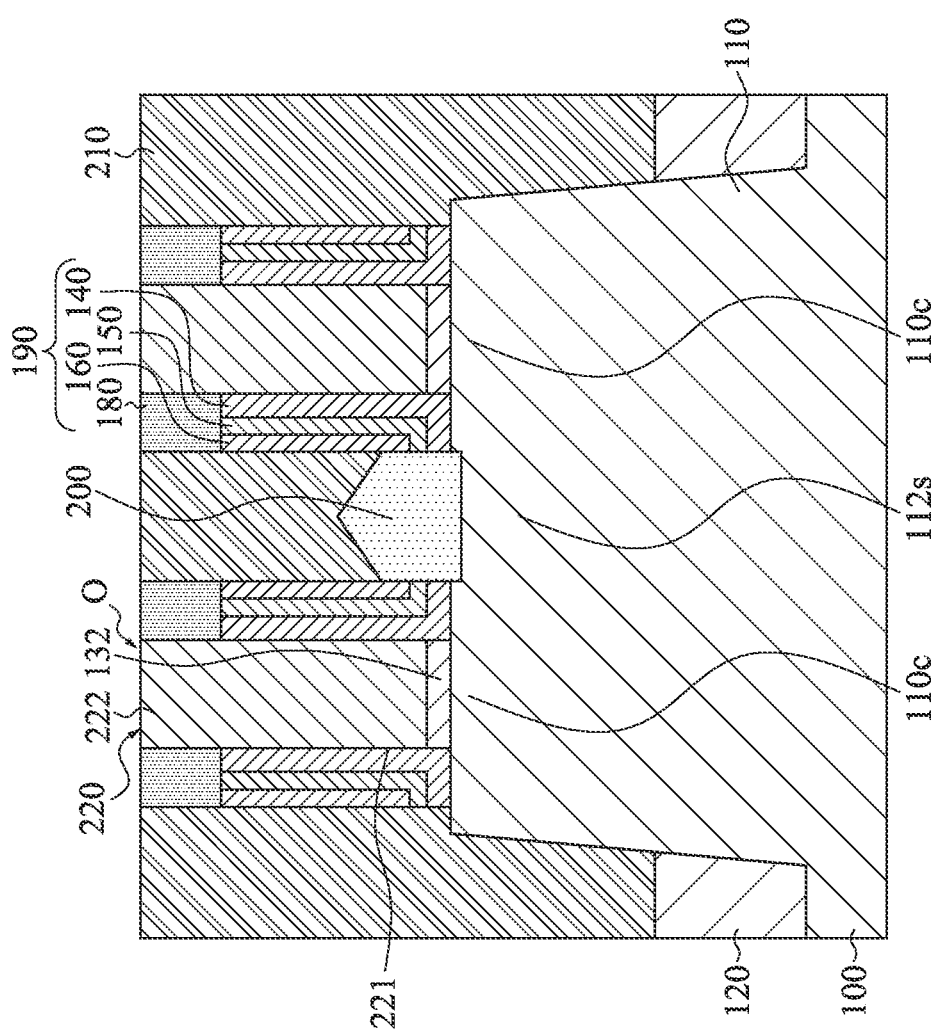
Fig. 12B
Fig. 12A

METHOD OF FORMING FINFET WITH LOW-DIELECTRIC-CONSTANT GATE ELECTRODE SPACERS

PRIORITY CLAIM AND CROSS-REFERENCE

The present application is a Continuation application of U.S. application Ser. No. 17/831,077, filed on Jun. 2, 2022, which is a Divisional application of U.S. application Ser. No. 15/396,900, filed on Jan. 3, 2017, which claims priority to U.S. Provisional Application Ser. No. 62/426,671, filed Nov. 28, 2016, which is herein incorporated by reference.

BACKGROUND

In the race to improve transistor performance as well as reduce the size of transistors, transistors have been developed such that the channel and source/drain regions are located in a fin on a bulk substrate. Such non-planar devices can be referred to as multiple-gate finFETs. A multiple-gate finFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 13A are cross-sectional views of a method of forming a semiconductor device at various stages in accordance with some embodiments.

FIGS. 1B to 13B are different cross-sectional views respectively corresponding to FIGS. 1A to 13A.

DETAILED DESCRIPTION

Figure 1B:
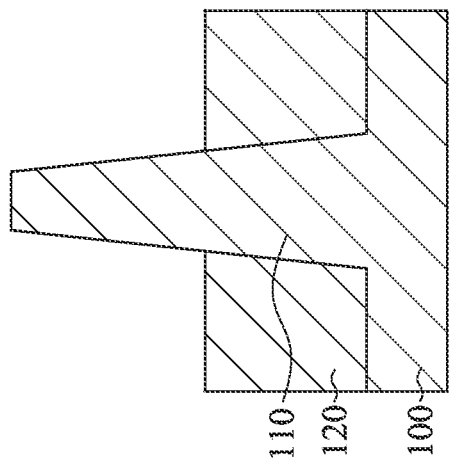

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present disclosure are semiconductor devices. Such a device, for example, is a Fin field effect transistor (FinFET) device. The following disclosure will continue with a FinFET example to illustrate various embodiments. It is understood, however, that the disclosure is not limited to a particular type of device.

Figure 1A:
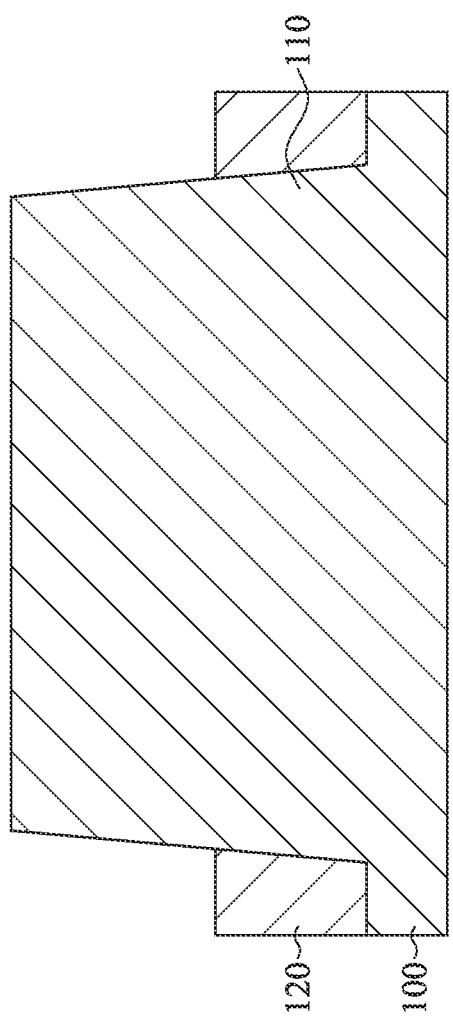

FIGS. 1A to 13A are cross-sectional views of a method of forming a semiconductor device at various stages in accordance with some embodiments. FIGS. 1B to 13B are different cross-sectional views respectively corresponding to FIGS. 1A to 13A. Reference is made to FIGS. 1A and 1B. A semiconductor fin 110 is formed on the substrate 100 and protrudes from the substrate 100. In some embodiments, the substrate 100 includes silicon. Alternatively, the substrate 100 may include germanium, silicon germanium, gallium arsenide or other appropriate semiconductor materials. Also alternatively, the substrate 100 may include an epitaxial layer. For example, the substrate 100 may have an epitaxial layer overlying a bulk semiconductor. Further, the substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 100 may include a semiconductor-on-insulator (SOI) structure. Also alternatively, the substrate 100 may include a buried dielectric layer, such as a buried oxide (BOX) layer, such as that formed by separation by implantation of oxygen (SIMOX) technology, wafer bonding, SEG, or other appropriate method.

In some embodiments, the semiconductor fin 110 includes silicon. The semiconductor fin 110 may be formed, for example, by patterning and etching the substrate 100 using photolithography techniques. In some embodiments, a layer of photoresist material (not shown) is sequentially deposited over the substrate 100. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 as shallow trench isolation (STI). The isolation dielectric 120 may include any suitable dielectric material, such as silicon oxide. The method of forming the isolation dielectric 120 may include depositing an isolation dielectric 120 on the substrate 100 to cover the semiconductor fin 110, optionally performing a planarization process, such as a chemical mechanical polishing (CMP) process, to remove the excess isolation dielectric 120 outside the trenches, and then performing an etching process on the isolation dielectric 120 until upper portions of the semiconductor fins 110 are exposed. In some embodiments, the etching process performed may be a wet etching process, for example, by dipping the substrate 100 in hydrofluoric acid (HF). In alternative embodiments, the etching process may be a dry etching process, for example, the dry etching process may be performed using $CHF_3$ or $BF_3$ as etching gases.

Figure 2B:
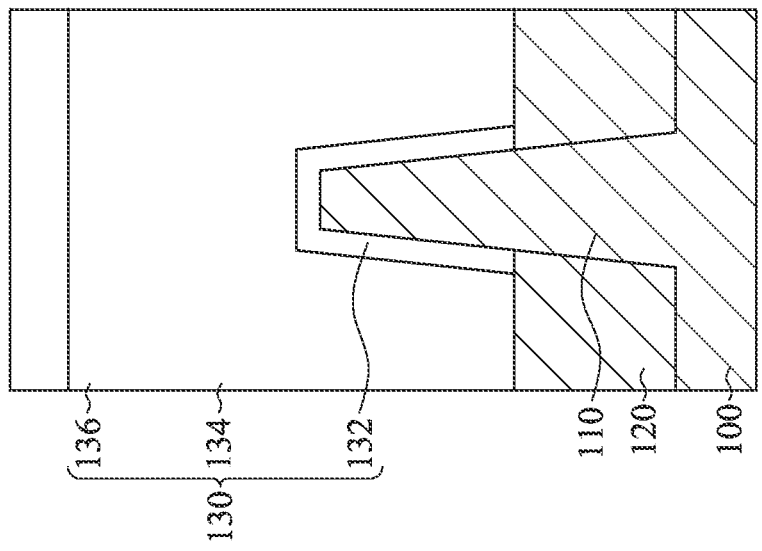
Figure 2A:
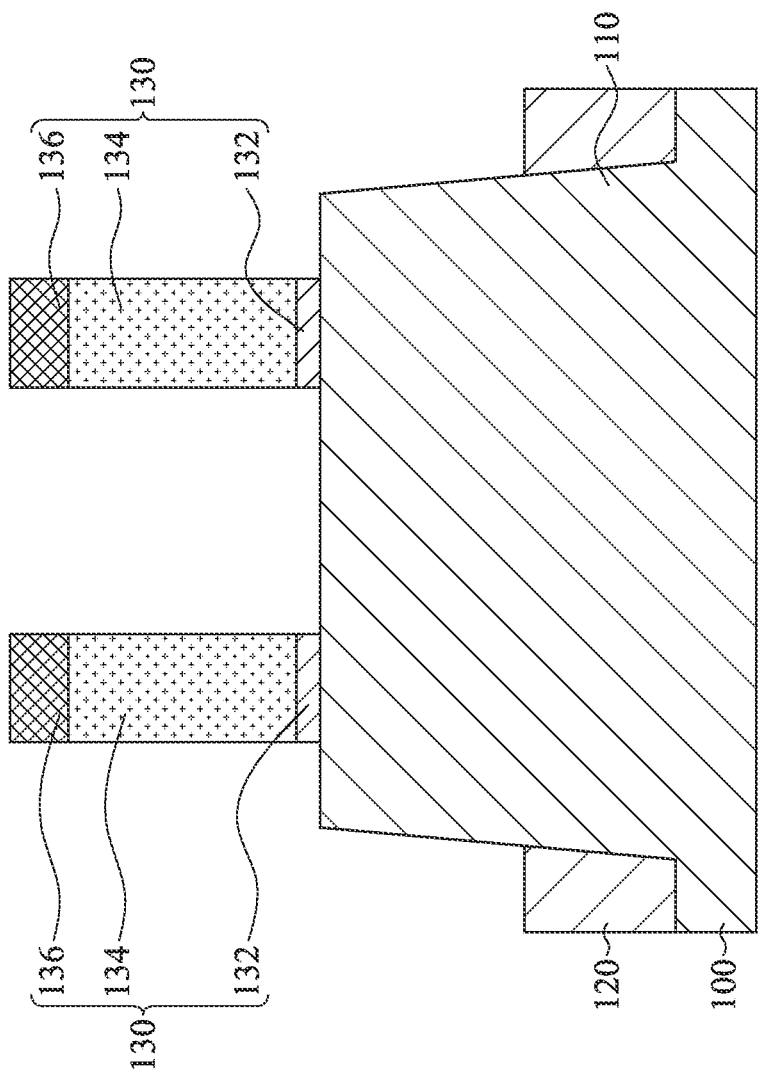

Reference is made to FIGS. 2A and 2B. Gate stacks 130 are formed on portions of the semiconductor fin 110 at interval and expose other portions of the semiconductor fin 110. In some embodiments using a gate-last process, the gate stacks 130 can serve as dummy gates and at least portions thereof will be replaced by final gate stacks at a subsequent stage. For example, portions of the dummy gate stacks 130 are to be replaced later by metal gate electrodes (MG) after high temperature thermal processes, such as thermal annealing for source/drain activation during the sources/drains formation. In some embodiments, the dummy gate stacks 130 include gate dielectrics 132, dummy electrodes 134 and gate masks 136. In some embodiments, the gate dielectrics 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectrics 132 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectrics 132 may have a multilayer structure such as one layer of silicon oxide (e.g., interfacial layer) and another layer of high-k material. The dummy electrodes 134 may include polycrystalline silicon (polysilicon), as examples. The gate masks 136 may include a suitable dielectric material, such as silicon nitride, silicon oxynitride or silicon carbide, as examples.

The dummy gate stacks 130 can be formed by deposition and patterning. For example, the gate dielectric 132 is blanket deposited on the structure shown in FIGS. 1A and 1B by a suitable technique, such as chemical vapor deposition (CVD). The dummy electrode 134 is deposited on the gate dielectric 132 by a suitable technique, such as CVD. The gate mask 136 is deposited on the dummy gate electrode 134 by a suitable technique, such as CVD. Then the gate mask 136 is patterned by a lithography process and an etching process, thereby forming openings in the gate mask 136, exposing the underlying dummy gate materials within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dummy gate materials through the openings of the gate mask 136 using the gate mask 136 as an etch mask, thereby forming the gate stacks 130 straddling portions of the semiconductor fin 110.

Figure 3B:
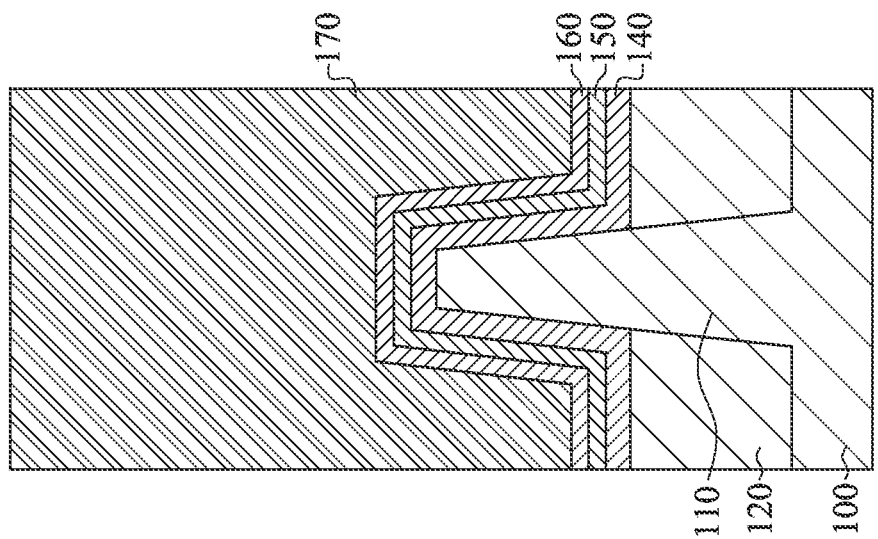
Figure 3A:
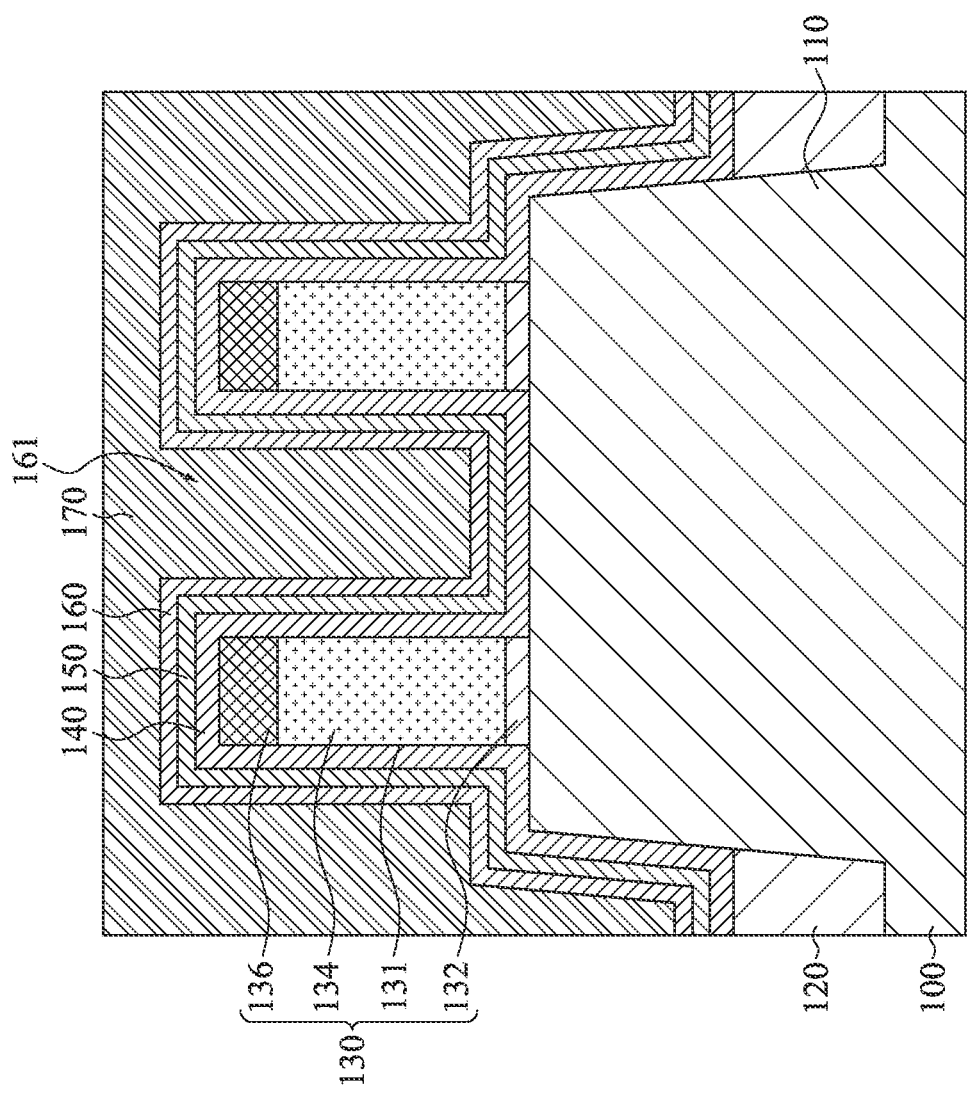

Reference is made to FIGS. 3A and 3B. A blanket first dielectric layer 140 is formed on the structure shown in FIGS. 2A and 2B. That is, the first dielectric layer 140 is conformally formed over at least the semiconductor fin 110 and the dummy gate stacks 130. Portions of the first dielectric layer 140 are located on sidewalls 131 of the dummy gate stacks 130, and these portions of the first dielectric layer 140 can be referred to as dielectric features on the sidewalls 131 of the dummy gate stacks 130. In some embodiments, the first dielectric layer 140 has a dielectric constant greater than about 3.7. Exemplary materials of the first dielectric layer 140 may include silicon oxycarbonitride (SiOCN), silicon oxycarbide (SiOC), silicon oxide, silicon nitride, silicon oxy-nitride, non-porous dielectric materials or other suitable material. The first dielectric layer 140 may be formed by a deposition process, such as an atomic layer deposition (ALD) process, a CVD process, a physical vapor deposition (PVD) process, a sputter deposition process or other suitable techniques. In the embodiments where the first dielectric layer 140 is made of SiOCN or SiOC, the dielectric constant may range from about 3.5 to about 5.

Next, a second dielectric layer 150 is conformally formed on the first dielectric layer 140. Portions of the second dielectric layer 150 are located on sidewalls 131 of the dummy gate stacks 130, and these portions of the second dielectric layer 150 can be referred to as dielectric features on the sidewalls 131 of the dummy gate stacks 130. The second dielectric layer 150 has a dielectric constant less than that of the first dielectric layer 140. For example, the second dielectric layer 150 may include a low-k dielectric material having a dielectric constant less than about 4.0. In some embodiments, the dielectric constant of the second dielectric layer 150 may range from about 1.5 to about 3.7. Exemplary low-k dielectric material may include hydrogen doped silicon oxycarbide (SiOC:H), low-k silicon oxycarbide (SiOC), spin-on dielectric (SOD), porous silicon dioxide, porous silicon oxycarbonitride (SiOCN), low-k silicon nitride, low-k silicon oxynitride, polyimide, spin-on glass (SOG), fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, Parylene, BCB (bis-benzocyclobutenes), SiLK (Dow Chemical of Midland, Mich.), other suitable low-k dielectric materials, and/or combinations thereof. The second dielectric layer 150 including the low-k dielectric material may be deposited using ALD, PVD or a CVD method such as plasma enhanced CVD (PECVD), low pressure CVD (LPCVD), or atomic layer CVD (ALCVD). In the embodiments where the second dielectric layer 150 is made of SiOC:H, the second dielectric layer 150 can be formed by a PECVD or high density PECVD process including organo-silane precursors such as tetramethylsilane, trimethylsilane or combinations thereof, and the second dielectric layer 150 may have the dielectric constant ranging from about 2.2 to about 3.2. In the embodiments wherein the second dielectric layer 150 is made of SiOC, the second dielectric layer 150 can be formed by CVD, and the dielectric constant thereof may range from about 3.5 to about 3.9. In the embodiments where the second dielectric layer 150 is made of spin-on dielectric, the second dielectric layer 150 may include low-k spin-on dielectric materials, such as a composition with silicon-hydrogen (Si—H) bonds, such as hydrogen silsesquioxane (HSQ) or methylsilsesquioxane (MSQ), and the dielectric constant of the second dielectric layer 150 may range from about 2.1 to about 2.5.

The low-k dielectric material of the second dielectric layer 150 is beneficial to reduce a parasitic capacitance between a gate stack and a contact plug formed in subsequently steps due to its low permittivity, and a resistive-capacitive (RC) time delay caused by the parasitic capacitance can be thus decreased. Moreover, the low-k second dielectric layer 150 and the first dielectric layer 140 have different etch properties. For example, the first and second dielectric layers 140 and 150 have different etch resistance properties. For example, the first dielectric layer 140 has an etch resistance to etching the dummy gate stacks 130, and this etch resistance of the first dielectric layer 140 is higher than that of the second dielectric layer 150. Therefore, the first dielectric layer 140 is not easier to be etched or removed compared to the second dielectric layer 150 during the etching performed to the dummy gate stacks 130. The second dielectric layer 150 can thus be protected by the first dielectric layer 140 during the etching performed to the dummy gate stacks 130. That is, the low-k feature can be protected by the first dielectric layer 140 during the etching performed to the dummy gate stacks 130.

Next, a third dielectric layer 160 is conformally formed on the second dielectric layer 150. Portions of the third dielectric layer 160 are located on sidewalls 131 of the dummy gate stacks 130, and these portions of the third dielectric layer 160 can be referred to as dielectric features on the sidewalls 131 of the dummy gate stacks 130. In some embodiments, the third dielectric layer 160 has a dielectric constant greater than about 3.7. Exemplary materials of the third dielectric layer 160 may include silicon oxycarbonitride (SiOCN), silicon oxycarbide (SiOC), silicon oxide, silicon nitride, silicon oxy-nitride, non-porous dielectric materials or other suitable material. The third dielectric layer 160 may be formed by a deposition process, such as an atomic layer deposition (ALD) process, a CVD process, a physical vapor deposition (PVD) process, a sputter deposition process or other suitable techniques. In the embodiments where the third dielectric layer 160 is made of SiOCN or SiOC, the dielectric constant may range from about 3.5 to about 5.

In some embodiments, the second dielectric layer 150 and the third dielectric layer 160 have different etch properties. For example, the second and third dielectric layers 150 and 160 have different etch resistance properties. For example, the third dielectric layer 160 has an etch resistance to an etching used to form source/drain regions in subsequent steps, and this etch resistance of the third dielectric layer 160 is higher than that of the second dielectric layer 150. Therefore, the third dielectric layer 160 is not easier to be etched or removed compared to the second dielectric layer 150 during the etching used to form the source/drain regions. The second dielectric layer 150 can thus be protected by the third dielectric layer 160 during the etching used to form the source/drain regions. That is, the low-k feature can be protected by the third dielectric layer 160 during the etching used to form the source/drain regions.

Next, a filling dielectric 170 is formed on the third dielectric layer 160 and fills a recess 161 of the third dielectric layer 160. In some embodiments, the filling dielectric 170 may overfill the recess 161 of the third dielectric layer 160. The filling dielectric 170 may not remain on sidewalls of the final gate stacks. As such, the dielectric constant of the filling dielectric 170 can be not limited. Exemplary materials of the filling dielectric 170 may include silicon oxycarbonitride (SiOCN), silicon oxycarbide (SiOC), silicon oxide, silicon nitride, silicon oxy-nitride, non-porous dielectric materials or other suitable material. The filling dielectric 170 may be formed by a deposition process, such as an atomic layer deposition (ALD) process, a CVD process, a physical vapor deposition (PVD) process, a sputter deposition process or other suitable techniques.

Figure 4B:
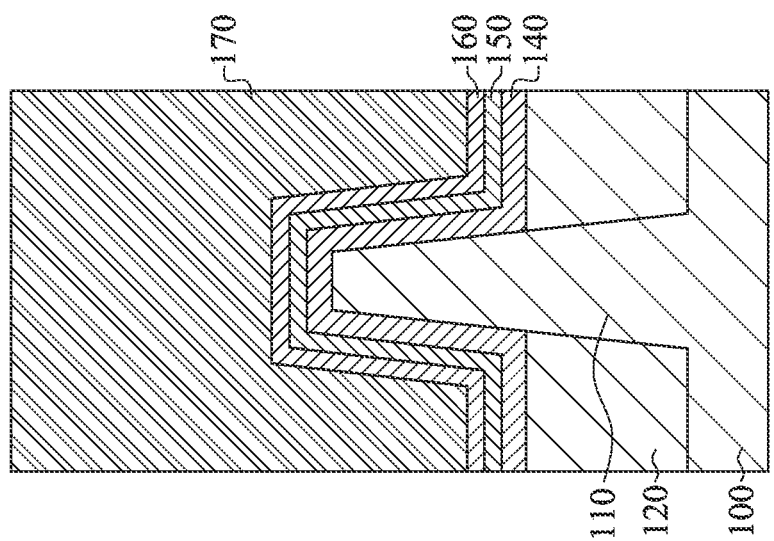
Figure 4A:
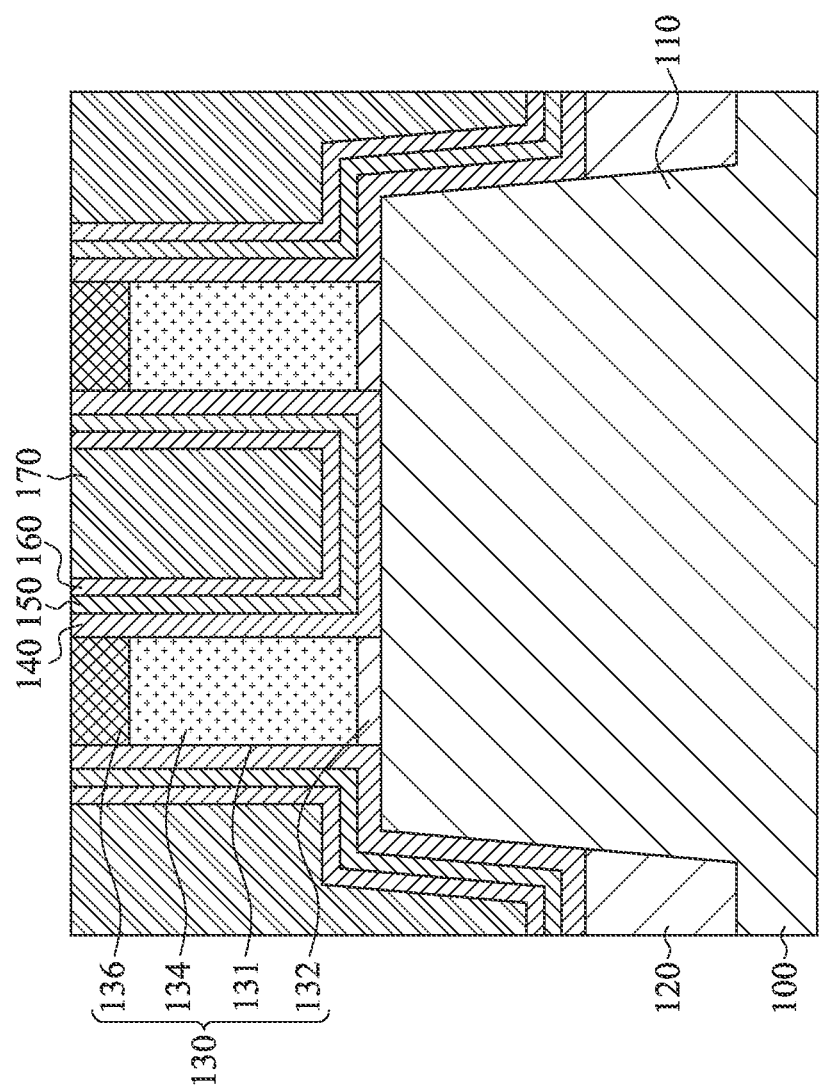

Reference is made to FIGS. 4A and 4B. A chemical mechanical polishing (CMP) process may be applied to remove excessive filling dielectric 170 and expose top surfaces of the dummy gate stacks 130, the first, second and third dielectric layers 140, 150 and 160 and the filling dielectric 170.

Figure 5B:
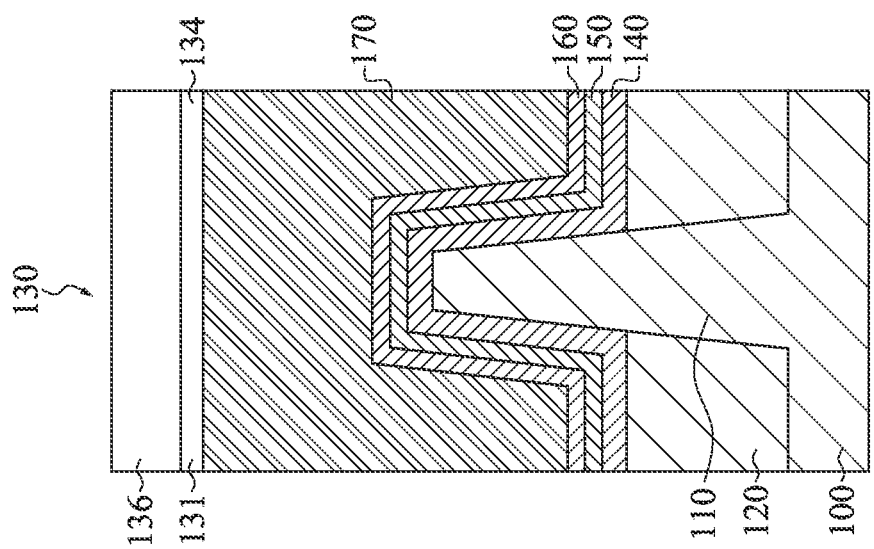
Figure 5A:
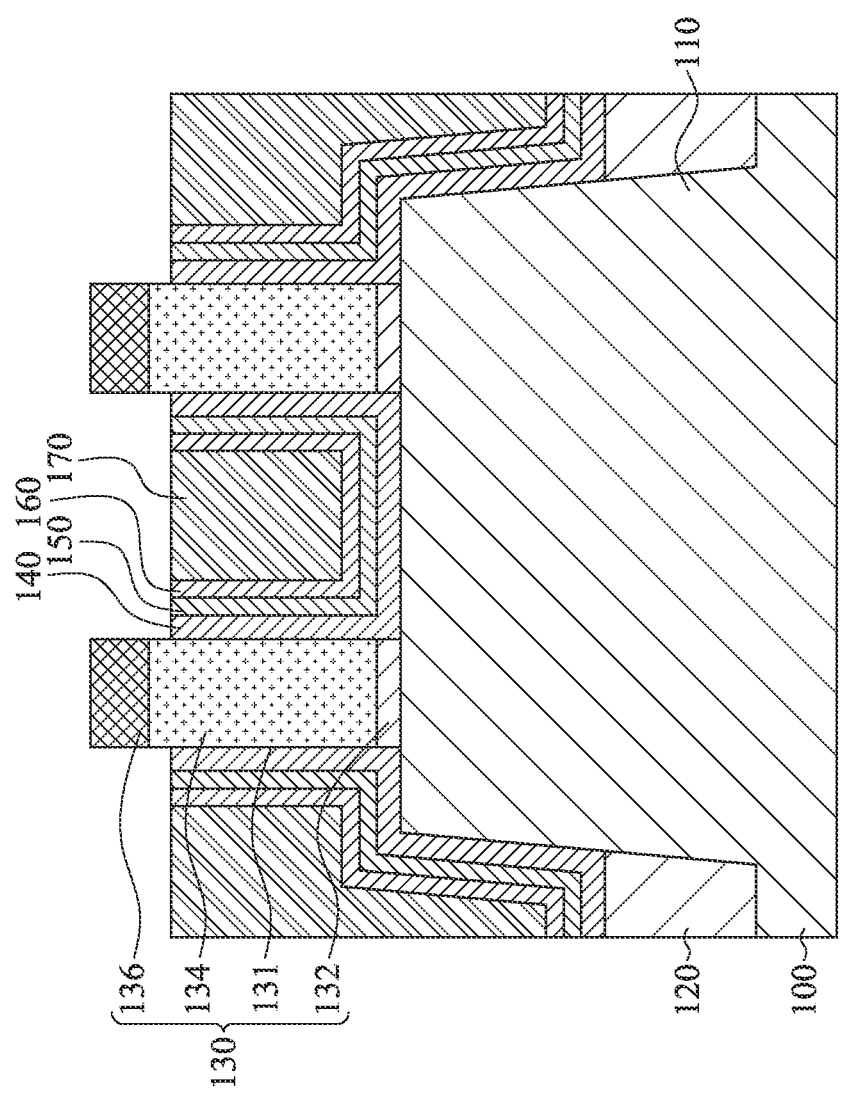

Reference is made to FIGS. 5A and 5B. An etching process is performed on the first, second and third dielectric layers 140, 150 and 160 and the filling dielectric 170, such that upper portions of the dummy gate stacks 130 are exposed. The etching process may be a wet etching process, a dry etching process or combinations thereof. After the etching process, upper portions of the sidewalls 131 of the dummy gate stacks 130 are exposed. For example, sidewalls of the gate masks 136 and upper portions of sidewalls of the dummy electrodes 134 are exposed.

Figure 6B:
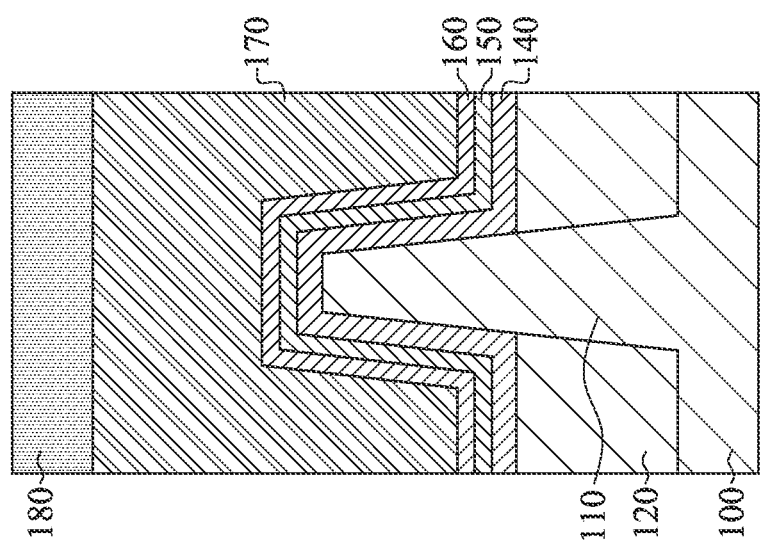
Figure 6A:
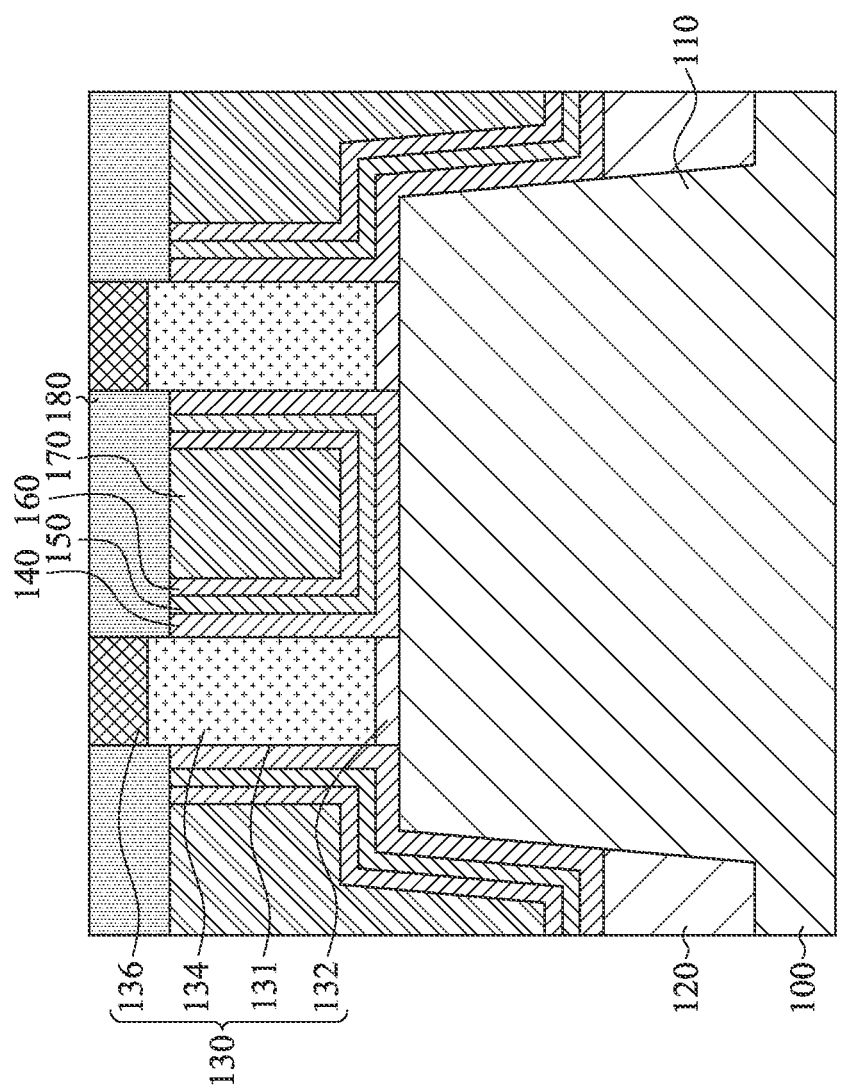

Reference is made to FIGS. 6A and 6B. A dielectric cap 180 is formed on the structure shown in FIGS. 5A and 5B. Therefore, the dielectric cap 180 at least caps the first, second and third dielectric layers 140, 150 and 160 and the filling dielectric 170. In other words, the first, second and third dielectric layers 140, 150 and 160 and the filling dielectric 170 are buried under the dielectric cap 180. Stated differently, the dielectric cap 180 is formed on the exposed portions of the sidewalls 131 of the dummy gate stacks 130. In some embodiments, the dielectric cap 180 has a dielectric constant greater than about 3.7. Exemplary materials of the dielectric cap 180 may include silicon oxycarbonitride (SiOCN), silicon oxycarbide (SiOC), silicon oxide, silicon nitride, silicon oxy-nitride, non-porous dielectric materials or other suitable material. The dielectric cap 180 may be formed by a deposition process, such as an atomic layer deposition (ALD) process, a CVD process, a physical vapor deposition (PVD) process, a sputter deposition process or other suitable techniques. In the embodiments where the dielectric cap 180 is made of SiOCN or SiOC, the dielectric constant may range from about 3.5 to about 5.

In some embodiments, the second dielectric layer 150 and the dielectric cap 180 have different etch properties. For example, the second dielectric layer 150 and the dielectric cap 180 have different etch resistance properties. For example, the dielectric cap 180 has an etch resistance to etching the dummy gate stacks 130, and this etch resistance of the dielectric cap 180 is higher than that of the second dielectric layer 150. Therefore, the dielectric cap 180 is not easier to be etched or removed compared to the underlying second dielectric layer 150 during the etching performed to the dummy gate stacks 130. The second dielectric layer 150 can thus be protected by the overlying dielectric cap 180 during the etching performed to the dummy gate stacks 130. That is, the low-k feature can be protected by the overlying dielectric cap 180 during the etching performed to the dummy gate stacks 130. Moreover, in some embodiments, the dielectric cap 180 has an etch resistance to the etching used to form source/drain regions in subsequent steps, and this etch resistance of the dielectric cap 180 is higher than that of the underlying second dielectric layer 150. Therefore, the dielectric cap 180 is not easier to be etched or removed compared to the underlying second dielectric layer 150 during the etching used to form the source/drain regions. The second dielectric layer 150 can thus be protected by the overlying dielectric cap 180 during the etching used to form the source/drain regions. That is, the low-k feature can be protected by the overlying dielectric cap 180 during the etching used to form the source/drain regions.

Afterward, a chemical mechanical polishing (CMP) process may be applied to remove excessive dielectric cap 180 outside the space between the dummy gate stacks 130 and expose top surfaces of the dummy gate stacks 130 and the dielectric cap 180. After the CMP process, the top surfaces of the dummy gate stacks 130 may be substantially level with that of the dielectric cap 180.

Reference is made to FIGS. 7A and 7B. A removal process is performed to remove portions of the dielectric cap 180 and their underlying portions of filling dielectric 170, third, second and first dielectric layers 160, 150 and 140. Remaining portions of the first, second and third dielectric layers 140, 150 and 160 and the overlying dielectric cap 180 can collectively serve as gate spacers 190 located on opposite sides of the dummy gate stacks 130. That is, two gate spacers 190 are respectively located on two opposite sidewalls 131 of a dummy gate stack 130. In one gate spacer 190, the first and third dielectric layers 140 and 160 are respectively located on opposite sidewalls of the second dielectric layer 150. That is, the first dielectric layer 140 is located on a sidewall of the second dielectric layer 150 proximal to the dummy gate stack 130, and the third dielectric layer 160 is located on a sidewall of the second dielectric layer 150 distal to the dummy gate stack 130. The dielectric cap 180 is wider than the second dielectric layer 150 and is located atop the first, second and third dielectric layers 140, 150 and 160. That is, the second dielectric layer 150 is located between the first and third dielectric layers 140 and 160 and underlies the dielectric cap 180. The dielectric cap 180 and the first and third dielectric layers 140 and 160 can be collectively referred to as a dielectric feature straddling the second dielectric layer 150. Therefore, the second dielectric layer 150 having the lowest dielectric constant of the gate spacer 190 can be protected by the first and third dielectric layers 140 and 160 and the dielectric cap 180 against subsequent etching processes, such as the etching performed to the dummy gate stacks 130, the etching used to form the source/drain regions, or combinations thereof.

In some embodiments, this removal process may remove portions of the semiconductor fin 110 as well. More particularly, portions of the semiconductor fin 110 underlying the removed portions of the dielectric cap 180 may be removed or recessed, and a recess R is thus formed on the semiconductor fin 110 and between the gate spacers 190. In other words, the remaining semiconductor fin 110 has at least one source/drain portion 110s and channel portions 110c. The channel portions 110c underlie respect dummy gate stacks 130, and the source/drain portion 110s is exposed by the dummy gate stacks 130 and the gate spacers 190. The source/drain portion 110s has a top lower than that of the channel portions 110c due to this removal process. In other words, this removal process may cause height loss to the exposed portion of the semiconductor fin 110. In some embodiments, the top of the source/drain portion 110s of the semiconductor fin 110 is higher than that of the isolation dielectric 120. Stated differently, the source/drain portion 110s protrudes with respect to the isolation dielectric 120. In some embodiments, a portion of the semiconductor fin 110 protruding with respect to the isolation dielectric 120 may be removed, so that the source/drain portion 110s may be formed as having a top lower than that of the isolation dielectric 120.

The removal process performed in FIGS. 7A and 7B may be, for example, an etching process, such as an anisotropic etching process. In some embodiments, the gate spacers 190 may be used to offset subsequently formed epitaxy structures on the semiconductor fin 110, such as source/drain epitaxy structures. The gate spacers 190 may further be used for designing or modifying the source/drain regions (junction) profile. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In the depicted embodiments, the dielectric layers 140, 150, 160 and 170 are absent except for in the gate spacers 190. In some other embodiments, at least some portions of the dielectric layers 140, 150, 160 and 170 remain, such as, on the isolation dielectric 120 and/or sidewalls of the semiconductor fin 110.

Figure 8B:
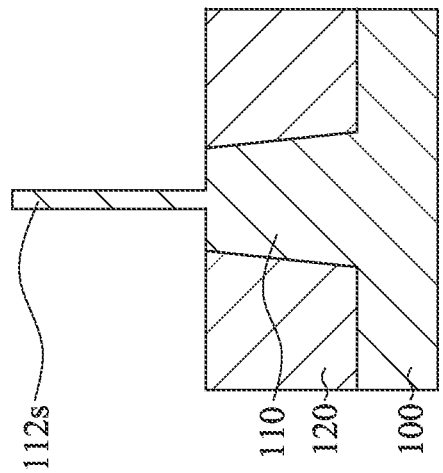
Figure 8A:
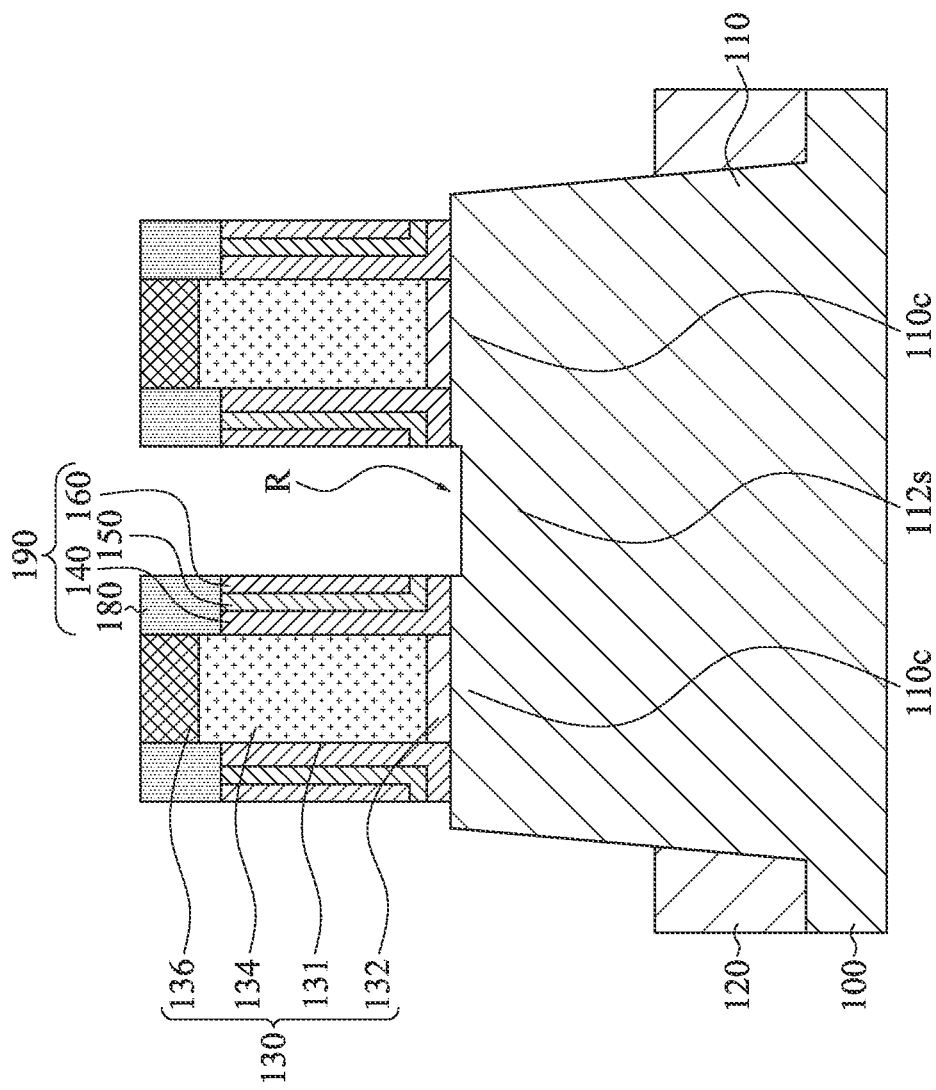

Reference is made to FIGS. 8A and 8B. A trimming process is preformed to the exposed source/drain portion 110s, so that the source/drain portion 110s protruding above the isolation dielectric 120 may be trimmed as a thinned source/drain portion 112s. The thinned source/drain portion 112s may be referred to as thinner semiconductor strips on the thicker semiconductor fin 110. The trimming or thinning process may include an etching process, such as a wet etching process, and the etchant may include a solution of HF, hydrogen peroxide ($H_2O_2$), and acetic acid ($CH_3COOH$), for example.

The etch resistance of the dielectric cap 180 to this etching process is higher than that of the second dielectric layer 150. That is, the etch resistance of the dielectric cap 180 to etching the source/drain portion 110s of the semiconductor substrate 100 is higher than that of the second dielectric layer 150. Therefore, the dielectric cap 180 is not easier to be etched or removed compared to the underlying second dielectric layer 150 during the etching process to trim or thin the semiconductor fin 110. The second dielectric layer 150 can thus be protected by the overlying dielectric cap 180 during this trimming process. That is, the low-k feature can be protected by the overlying dielectric cap 180 during this trimming process. Similarly, the etch resistance of the third dielectric layer 160 to this etching process is higher than that of the second dielectric layer 150. That is, the etch resistance of the third dielectric layer 160 to etching the source/drain portion 110s of the semiconductor substrate 100 is higher than that of the second dielectric layer 150. As such, the low-k feature can be protected by the adjacent third dielectric layer 160 during this trimming process.

As a result of the trimming or thinning, the width of the thinned source/drain portion 112s is reduced from its original width W2 before the thinning to width W1 after the thinning. In some embodiments, width W1 is between about 50 percent and about 70 percent of width W2, although width W1 may be greater or smaller. After the trimming process, a lightly doped source and drain (LDD) implantation process is performed to the thinned source/drain portion 112s. One or more annealing processes may be performed to the thinned source/drain portion 112s after performing the LDD implantation.

Figure 9B:
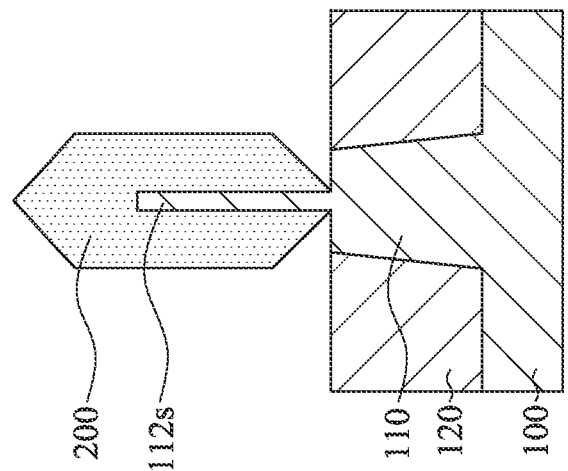
Figure 9A:
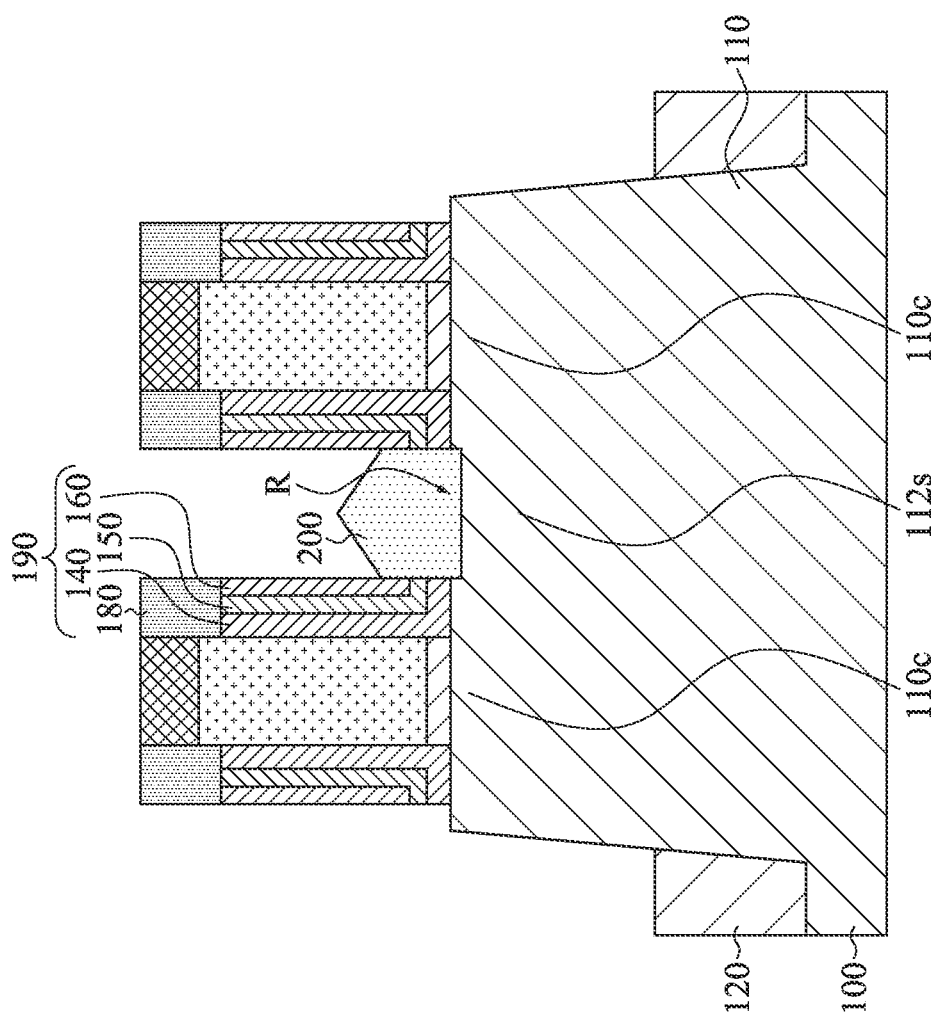

Reference is made to FIGS. 9A and 9B. An epitaxy structure 200 is formed on the thinned source/drain portion 112s of the semiconductor fin 110. The thinned source/drain portion 112s protruding above the isolation dielectric 120 can be wrapped by the epitaxy structure 200, as shown in FIG. 9B. The epitaxy structure 200 and the thinned source/drain portion 112s wrapped by the epitaxy structure 200 can be collectively referred to as a source/drain region with cladding. As illustrated in FIGS. 7B, 8B and 9B, the formation of the source/drain region includes thinning, but not totally removing, an original portion of semiconductor fin 110 above the isolation dielectric 120, and then epitaxially growing epitaxy structure 200 on the thinned portion of the semiconductor fin 110 above the isolation dielectric 120. This may be advantageous to maintain the strain in channel portions 110c, and may be advantageous to reduce height losses of the gate spacers 190.

The epitaxy structure 200 may be formed using one or more epitaxy or epitaxial (epi) processes, such that a Si feature, a SiGe feature, and/or other suitable features can be formed in a crystalline state around the thinned source/drain portion 112s of the semiconductor fin 110. In some embodiments, the lattice constant of the epitaxy structures 200 is different from the lattice constant of the semiconductor fin 110, so that the channel portions 110c of the semiconductor fin 110 can be strained or stressed by the epitaxy structures 200 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the thinned source/drain portion 112s of the semiconductor fin 110 (e.g., silicon). Thus, a strained channel can be achieved to increase carrier mobility and enhance device performance. The epitaxy structure 200 may be in-situ doped. The doping species include P-type dopants, such as boron or $BF_2$; N-type dopants, such as phosphorus or arsenic; and/or other suitable dopants including combinations thereof. If the epitaxy structure 200 is not in-situ doped, a second implantation process (i.e., a junction implant process) is performed to dope the epitaxy structure 200. One or more annealing processes may be performed to activate the epitaxy structure 200. The annealing processes include rapid thermal annealing (RTA) and/or laser annealing processes.

Reference is made to FIGS. 10A and 10B. An interlayer dielectric (ILD) layer 210 is formed on the substrate 100 the cover the semiconductor fin 110, the dummy gate stacks 130, the gate spacers 190 and the epitaxy structure 200. The ILD layer 210 includes silicon oxide, silicon nitride, silicon oxynitride, silicon carbide, low-k dielectric material or a combination thereof. The ILD layer 210 includes a single layer or multiple layers. The ILD layer 210 is formed by a suitable technique, such as CVD. Afterward, a chemical mechanical polishing (CMP) process may be applied to remove excessive ILD layer 210 and expose top surfaces of the dummy gate stacks 130 to a subsequent dummy gate removal process.

Reference is made to FIGS. 11A and 11B. At least portions of the dummy gate stacks 130 (see FIGS. 10A and 10B) are removed to form gate trenches O with the gate spacers 190 as their sidewalls. That is, the gate trenches O are defined by the gate spacers 190. In some embodiments, the dummy electrodes 134 and the gate masks 136 are removed while the gate dielectrics 132 retain as shown in FIG. 11A. In the embodiments where the gate dielectrics 132 include high-k dielectric materials, the high-k gate dielectrics 132 are formed prior to the formation of the gate spacers 190, so that inner walls of the gate spacers 190 may not be blanket covered by high-k dielectric materials. Stated differently, inner walls of the gate spacers 190 may be substantially free from coverage of high-k dielectric materials in some embodiments. This arrangement may be beneficial to reduce the parasitic capacitance between the subsequently formed gate stack and contact plug. Alternatively, in some other embodiments, the gate dielectrics 132 can be removed as well. The dummy gate stacks 130 may be removed by dry etching, wet etching, or a combination of dry and wet etching. For example, a wet etching process may include exposure to a hydroxide containing solution (e.g., ammonium hydroxide), deionized water, and/or other suitable etchant solutions.

The etch resistance of the dielectric cap 180 to this etching process is higher than that of the second dielectric layer 150. That is, the etch resistance of the dielectric cap 180 to etching the gate trenches O is higher than that of the second dielectric layer 150. Therefore, the dielectric cap 180 is not easier to be etched or removed compared to the underlying second dielectric layer 150 during the etching the gate trenches O. The second dielectric layer 150 can thus be protected by the overlying dielectric cap 180 during the etching the gate trenches O. That is, the low-k feature can be protected by the overlying dielectric cap 180 during the etching the gate trenches O. Similarly, the etch resistance of the first dielectric layer 140 to the etching the gate trenches O is higher than that of the second dielectric layer 150. As such, the low-k feature can be protected by the adjacent first dielectric layer 140 during the etching the gate trenches O.

Reference is made to FIGS. 12A and 12B. Gate conductors 222 are respectively formed in the gate trenches O between the gate spacers 190. The gate conductors 222 and the respective underlying gate dielectrics 132 can be collectively referred to as gate stacks 220. The gate stacks 220 straddle the semiconductor fin 110 and extend along the gate spacers 190. The gate spacers 190 are present on sidewalls 221 of the gate stacks 220. In some embodiments, the gate conductors 222 may include work function metals to provide suitable work functions for the gate stacks 220. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. On the other hand, if an N-type work function metal (N-metal) for NMOS devices is desired, N-type metal materials may be used. Examples of N-type work function materials include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The gate conductors 222 may further include filling metals located on the work function metals and filling recesses in the work function metals. The filling metals may include tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate conductors 222 may include blanket forming one or more work function metal layers over the structure shown in FIGS. 11A and 11B, forming filling metal over the work function metal layers, wherein some portions of the filling metal overfill the gate trenches O shown in FIG. 11A, and then performing a CMP process to remove excessive filling metal and work function metal layers outside the gate trenches O.

Figure 13B:
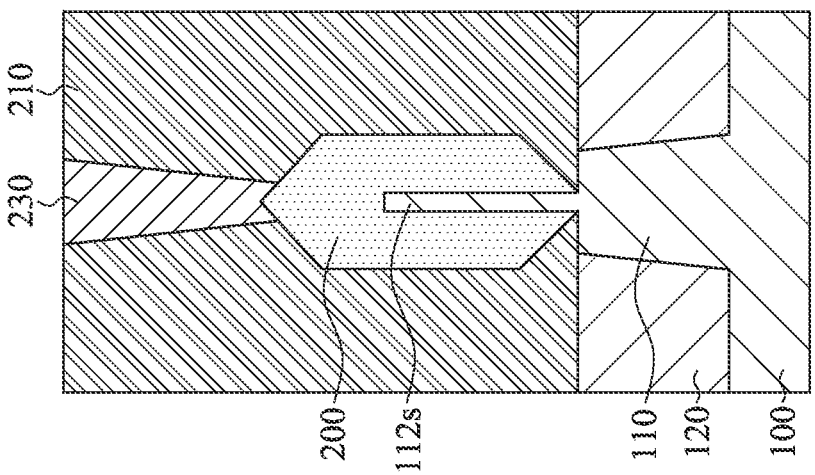
Figure 13A:
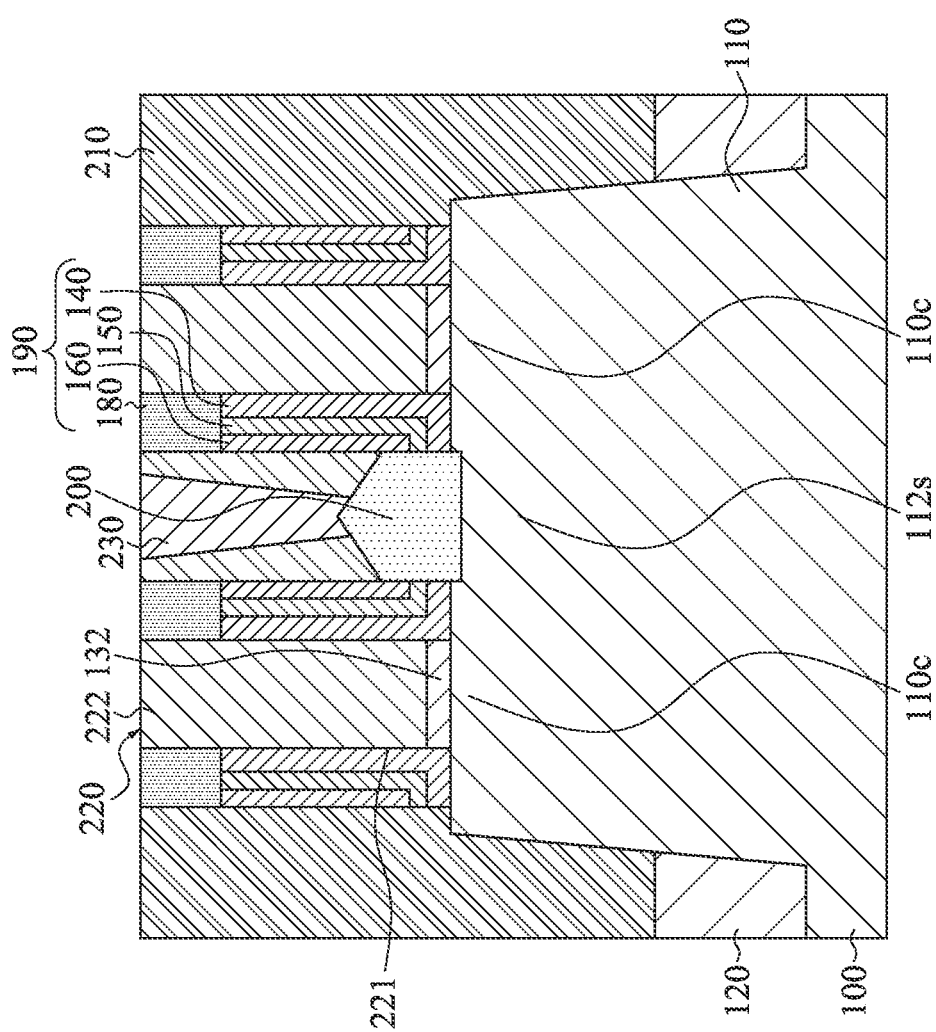

Reference is made to FIGS. 13A and 13B. A conductive feature, such as a contact plug 230, is formed through the ILD layer 210 and contacts with a top of the epitaxy structure 200. The contact plug 230 can thus serve as source/drain contacts. The low-k second dielectric layer 150 is located between the contact plug 230 and the gate stack 220, and therefore, the low-k second dielectric layer 150 can reduce the parasitic capacitance between the gate stack 220 and the contact plug 230, thereby decreasing the RC time delay.

Exemplary formation method of the contact plug 230 may include forming a contact hole by one or more etching processes to sequentially etch through the ILD layer 210 down to the epitaxy structure 200, and depositing metal or other suitable conductive materials in the contact hole by a deposition process, such as a CVD process, to form the contact plug 230.

In some embodiments, there is a low-k dielectric feature in the gate spacer between the contact plug and the gate stack. This low-k dielectric feature is advantageous to reduce the parasitic capacitance between the gate stack and the contact plug. The RC time delay can be decreased, accordingly. Moreover, the low-k dielectric feature is straddled by other dielectric feature. Therefore, the low-k dielectric feature can be protected against etching processes, such as etching in a gate replacement process, etching used to form source/drain regions, or combinations thereof.

In some embodiments of the present disclosure, a method includes forming a gate stack over a fin of a substrate; sequentially depositing a first dielectric layer, a second dielectric layer, a third dielectric layer, and a filling dielectric over the gate stack, wherein the second dielectric layer has a lower dielectric constant than dielectric constants of the first and third dielectric layers; forming a dielectric cap over the first, second, third dielectric layers and the filling dielectric; etching the dielectric cap, the first, second, third dielectric layers, and the filling dielectric simultaneously, to form gate spacers on opposite sidewalls of the gate stack and expose a top surface of the fin, wherein each of the gate spacers comprises remaining portions of the dielectric cap and the first, second, and third dielectric layers; and after the gate spacers are formed, forming an epitaxy source/drain structure in contact with one of the gate spacers and the top surface of the fin.

In some embodiments of the present disclosure, a method includes forming first and second gate stacks over a fin of a substrate; sequentially depositing a first dielectric layer, a second dielectric layer, and a third dielectric layer lining sidewalls of the first and second gate stacks and a top surface of the fin, wherein the second dielectric layer has a lower dielectric constant than dielectric constants of the first and third dielectric layers; depositing a filling dielectric over the gate stack, wherein the filling dielectric overfills a space between the first and second gate stacks; etching back the first, second, third dielectric layers and the filling dielectric; forming a dielectric cap over the first, second, third dielectric layers and the filling dielectric, wherein a portion of the filling dielectric between the first and second gate stacks is sealed by the third dielectric layer and the dielectric cap; etching the dielectric cap, the first, second, third dielectric layers, and the filling dielectric simultaneously, to form first gate spacers on the sidewalls of the first gate stack and second gate spacers on the sidewalls of the second gate stack; and forming epitaxy source/drain structure over the fin.

In some embodiments of the present disclosure, a method includes forming a gate stack over a fin of a substrate, wherein the gate stack comprises a gate dielectric, a gate electrode, and a gate mask over the gate electrode; sequentially depositing a first dielectric layer, a second dielectric layer, a third dielectric layer, and a filling dielectric over the gate stack, wherein the second dielectric layer has a lower dielectric constant than dielectric constants of the first and third dielectric layers; etching back the first, second, third dielectric layers and the filling dielectric, such that top surfaces of the first, second, third dielectric layers and the filling dielectric are lower than an interface between the gate electrode and the gate mask; forming a dielectric cap over the top surfaces of the first, second, third dielectric layers and the filling dielectric; etching the dielectric cap, the first, second, third dielectric layers, and the filling dielectric simultaneously, to form gate spacers on opposite sidewalls of the gate stack and expose a top surface of the fin; and after etching the dielectric cap, the first, second, third dielectric layers, and the filling dielectric, forming an epitaxy source/drain structure over the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate stack over a fin of a substrate;
    sequentially depositing a first dielectric layer, a second dielectric layer, and a filling dielectric over the gate stack, wherein the second dielectric layer has a lower dielectric constant than a dielectric constant of the first dielectric layer;
    polishing the first dielectric layer, the second dielectric layer, and the filling dielectric to expose a top surface of a gate mask of the gate stack;
    etching back the first dielectric layer, the second dielectric layer, and the filling dielectric such that top surfaces of the first dielectric layer, the second dielectric layer, and the filling dielectric are lower than a gate electrode of the gate stack;
    forming a dielectric cap over the first and second dielectric layers and the filling dielectric;
    etching the dielectric cap, the first and second dielectric layers, and the filling dielectric simultaneously, to form gate spacers on opposite sidewalls of the gate stack, wherein each of the gate spacers comprises remaining portions of the dielectric cap and the first and second dielectric layers; and
    forming an epitaxy source/drain structure over the fin.

2. The method of claim 1, further comprising depositing a third dielectric layer over the second dielectric layer prior to depositing the filling dielectric.

3. The method of claim 2, wherein a dielectric constant of the second dielectric layer is lower than a dielectric constant of the third dielectric layer.

4. The method of claim 1, wherein etching the dielectric cap, the first and second dielectric layers, and the filling dielectric is performed such that an entirety of the filling dielectric is removed.

5. The method of claim 1, wherein etching the dielectric cap, the first and second dielectric layers, and the filling dielectric comprises removing a portion of the fin.

6. A method, comprising:
    forming first and second gate stacks over a fin of a substrate;

sequentially depositing a first dielectric layer, a second dielectric layer, and a third dielectric layer lining sidewalls of the first and second gate stacks and a top surface of the fins;

depositing a filling dielectric over the first and second gate stacks, wherein the filling dielectric overfills a space between the first and second gate stacks;

etching back the first, second, and third dielectric layers and the filling dielectric;

forming a dielectric cap over the first, second, and third dielectric layers and the filling dielectric after etching back the first, second, and third dielectric layers and the filling dielectric, wherein the dielectric cap has a portion laterally between and in contact with the first and second gate stacks;

etching the dielectric cap, the first, second, and third dielectric layers, and the filling dielectric to form first gate spacers on the sidewalls of the first gate stack and second gate spacers on the sidewalls of the second gate stack; and forming an epitaxy source/drain structure over the fin.

7. The method of claim 6, wherein a dielectric constant of the second dielectric layer is lower than dielectric constants of the first and third dielectric layers.

8. The method of claim 6, wherein a dielectric constant of the second dielectric layer is lower than 4.

9. The method of claim 6, wherein etching the dielectric cap, the first, second, and third dielectric layers, and the filling dielectric is performed such that an entirety of the filling dielectric is removed.

10. The method of claim 6, wherein etching back the first, second, and third dielectric layers and the filling dielectric is performed such that a top surface of the filling dielectric is lower than a gate electrode of the first gate stack.

11. The method of claim 6, wherein forming the dielectric cap is performed such that the dielectric cap is in contact with a top surface of the filling dielectric.

12. The method of claim 6, wherein forming the dielectric cap is performed such that a portion of the dielectric cap between the first and second gate stacks is wider than a portion of the filling dielectric between the first and second gate stacks.

13. A method, comprising:

forming a gate stack over a fin of a substrate;

sequentially depositing a first dielectric layer, a second dielectric layer, and a filling dielectric over the gate stack, wherein the second dielectric layer has a lower dielectric constant than a dielectric constant of the first dielectric layer;

etching back the first and second dielectric layers and the filling dielectric;

forming a dielectric cap over the first and second dielectric layers and the filling dielectric after etching back the first and second dielectric layers and the filling dielectric, wherein the dielectric cap is wider than the filling dielectric;

performing an etching process on the dielectric cap, the first and second dielectric layers, and the filling dielectric, to form gate spacers on opposite sidewalls of the gate stack, wherein an entirety of the filling dielectric is removed after the gate spacers are formed; and forming an epitaxy source/drain structure over the fin.

14. The method of claim 13, further comprising depositing a third dielectric layer over the second dielectric layer prior to depositing the filling dielectric.

15. The method of claim 14, wherein a dielectric constant of the second dielectric layer is lower than a dielectric constant of the third dielectric layer.

16. The method of claim 13, wherein prior to performing the etching process, the dielectric cap is in contact with a top surface of the filling dielectric.

17. The method of claim 13, further comprising polishing the first and second dielectric layers and the filling dielectric prior to etching back the first and second dielectric layers and the filling dielectric.

18. The method of claim 17, wherein polishing the first and second dielectric layers and the filling dielectric is performed to expose a top surface of a gate mask of the gate stack.

19. The method of claim 13, wherein etching back the first and second dielectric layers and the filling dielectric is performed such that top surfaces of the first and second dielectric layers and the filling dielectric are lower than a top surface of a gate electrode of the gate stack.

20. The method of claim 13, wherein the dielectric cap is formed in contact with the first and second dielectric layers and the filling dielectric.

* * * * *